(12) United States Patent
Taura

(10) Patent No.: US 6,760,254 B2
(45) Date of Patent: Jul. 6, 2004

(54) SEMICONDUCTOR MEMORY DEVICE (75) Inventor: Tadayuki Taura, Zushi (JP)

(73) Assignee: Kabushiki Kaisha Toshiba, Tokyo (JP)

(*) Notice: Subject to any disclaimer, the term of this patent is extended or adjusted under 35 U.S.C. 154(b) by 47 days.

(21) Appl. No.: 10/235,655

(22) Filed: Sep. 6, 2002

(65) Prior Publication Data
US 2003/0048686 A1 Mar. 13, 2003

(30) Foreign Application Priority Data
Sep. 7, 2001 (JP) .................................. 2001-272072

(51) Int. Cl.[7] ............................................. G11C 16/04
(52) U.S. Cl. ........................ 365/185.11; 365/185.12; 365/185.13; 365/189.04
(58) Field of Search ................ 365/185.11, 185.12, 365/185.13, 51, 63, 189.04

(56) References Cited

U.S. PATENT DOCUMENTS 6,226,212 B1 * 5/2001 Sakamoto et al. .......... 365/207
6,512,693 B2 * 1/2003 Honda et al. ........... 365/185.13
6,548,903 B2 * 4/2003 Nakamura et al. ........... 257/758
2003/0112662 A1  6/2003 Tanzawa et al.

FOREIGN PATENT DOCUMENTS

JP  2001-325795  11/2001

* cited by examiner

Primary Examiner—Son Mai
(74) Attorney, Agent, or Firm—Banner & Witcoff, Ltd.

(57) ABSTRACT

A semiconductor memory circuit is disclosed, which comprises a plurality of memory cell blocks, a plurality of sub data lines, a first bank region including the plurality of memory cell blocks and the plurality of sub data lines, at least one of second bank region arranged, a plurality of data read lines, a plurality of first amplifier circuits connected to the plurality of data read lines, a plurality of auto data lines, a plurality of second amplifier circuits connected to the plurality of auto data read lines, a plurality of switch circuits provided in correspondence to the plurality of memory cell blocks, wherein data in the plurality of memory cells of the second bank region are readable from the plurality of first amplifier circuits, even when data in the plurality of memory cells of the first bank region is being read from the plurality of second amplifier circuits.

20 Claims, 6 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2001-272072, filed Sep. 7, 2001, the entire contents of which are incorporated herein by reference.

BACKGROUND OF THE INVENTION

1. Field of the Invention

The present invention relates to an electrically erasable and programmable nonvolatile semiconductor memory device (EEPROM), particularly relates to, in the semiconductor memory device having a plurality of banks in which memory elements of a MOS type of transistor structure are formed with the memory elements arranged in a matrix form, the semiconductor memory device having an arrangement in which a certain bank can be read while erase or write is being performed in another bank, and it is utilized for a flash erasable semiconductor memory device (flash memory).

2. Description of the Related Art

A NMOS transistor having double layer stacked gate structure on a double well formed on a semiconductor substrate is known as a memory cell of the EEPROM.

Figure 4:
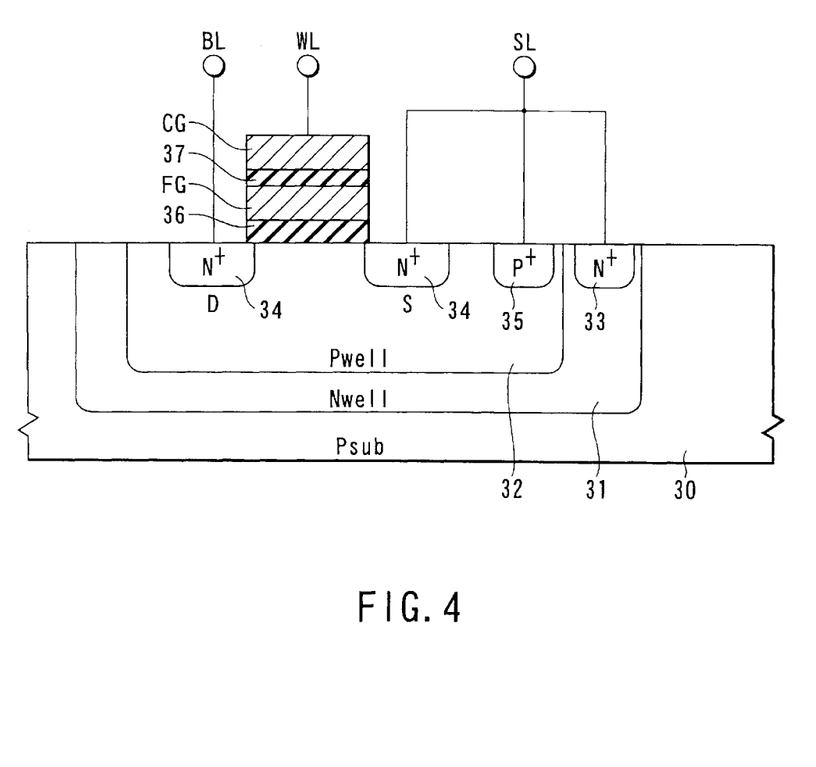
FIG. 4 is a cross-sectional view showing an example of a cell including a NMOS transistor of double layer stacked gate structure.

FIG. 4 is a cross-sectional view showing an example of a cell including the NMOS transistor having the double layer stacked gate structure.

In FIG. 4, reference numeral 30 is a P type substrate (Psub), 31 is an N type well (Nwell) and 32 is a P type well (Pwell) formed in the N type well. In the N type well 31, a well leading electrode is formed of an N+type diffusion layer 33. In the P type well 32, a source S and a drain D of the NMOS transistor are formed by an N+type diffusion layer 34 and the well leading electrode of the well is formed by a P+ type diffusion layer 35.

A floating gate FG made of a poly-crystalline silicon layer of a first layer is formed on a gate insulation film 36, a control gate CG made of the poly-crystalline silicon layer of a second layer is formed with the control gate CG separated by a insulation film 37.

In the actual semiconductor memory device, a plurality of cells are arranged in a matrix form on one well, any one of cells is selected by a plurality of row lines WL connected to the control gate CG of the cell of each row and a plurality of column lines BL connected to the drain D of the cell of each row. The source S, the N type well 31 and the P type well 32 of all cells are commonly connected with a source line SL.

Operation of the cell will be briefly described as an example of an NOR type memory cell which applies high voltage to the channel to erase.

In-case of erasing data, for example, by applying 10V to the source line SL, the voltage of 10V is applied to the source S, the N type well 31 and the P type well 32 of the cell. By applying, for example, −7V to all row lines WL, the voltage of −7V is applied to all control gates CG. The drain D is made to be a floating state. At this point, electrons in the floating gate FG are emitted into a channel by Fowler-Nordheim (FN) tunneling. A threshold of the cell becomes lower at this state, and data of this erase state is normally referred to as "1".

In case of writing data, for example, any one of a plurality of row lines WL is set to 9V, for example, any one of a plurality of column lines BL is set to 5V, for example, and the source line SL is set to 0V in order to select the cell to be written. At this point, in the selected cell, electrons are injected into the floating gate FG by hot electron injection. The threshold of the cell becomes higher at this state, and data of this write state is normally referred to as "0".

In case of reading data, for example, any one of a plurality of row lines WL is set to, for example, 5V, any one of a plurality of column lines BL is set lower voltage (for example, 0.7V) and the source line SL is set to 0V in order to select the cell to be read. At this point, in case that the selected cell is in the write state (data are "0"), current does not flow because the cell is not turned on. On the other hand, in case that data of the selected cell is in the erase state (data are "1"), cell current of about 40 $\mu$A flows because the cell is turned on. The amplitude of the current is sensed and amplified by a sense amplifier circuit (not shown) or the like to read data.

Though the NOR type memory cell which applies high voltage to the channel to erase is taken as the example in the above description of the operation, the same operation is also performed in a memory cell which applies high voltage to the source to erase.

Recently, the semiconductor memory device is used, for example, as a component of a portable device and utilized for storing various programs and personal data, there are strong demands storing programs or data in one semiconductor memory device in order to reduce the number of required memory chips in a system.

However, required time for re-writing data becomes relatively longer in case that the cell shown in FIG. 4 is used. Normally it takes about 10 $\mu$sec to write data and it takes about several hundreds of msec to as much as several sec for a block to erase data, it is impossible to read data during re-writing the data.

A memory system known as a RWW (Read While Write) type, which is able to read data in a certain memory area while data are written or erased in another memory area, has been proposed.

The present applicant has proposed Japanese Patent Application No. 2000-127106 of "semiconductor device" which can concretely realize a flash memory capable of writing or erasing data and reading data simultaneously by using the NMOS transistor of the double layer stacked gate structure shown in FIG. 4 as the cell.

Figure 5:
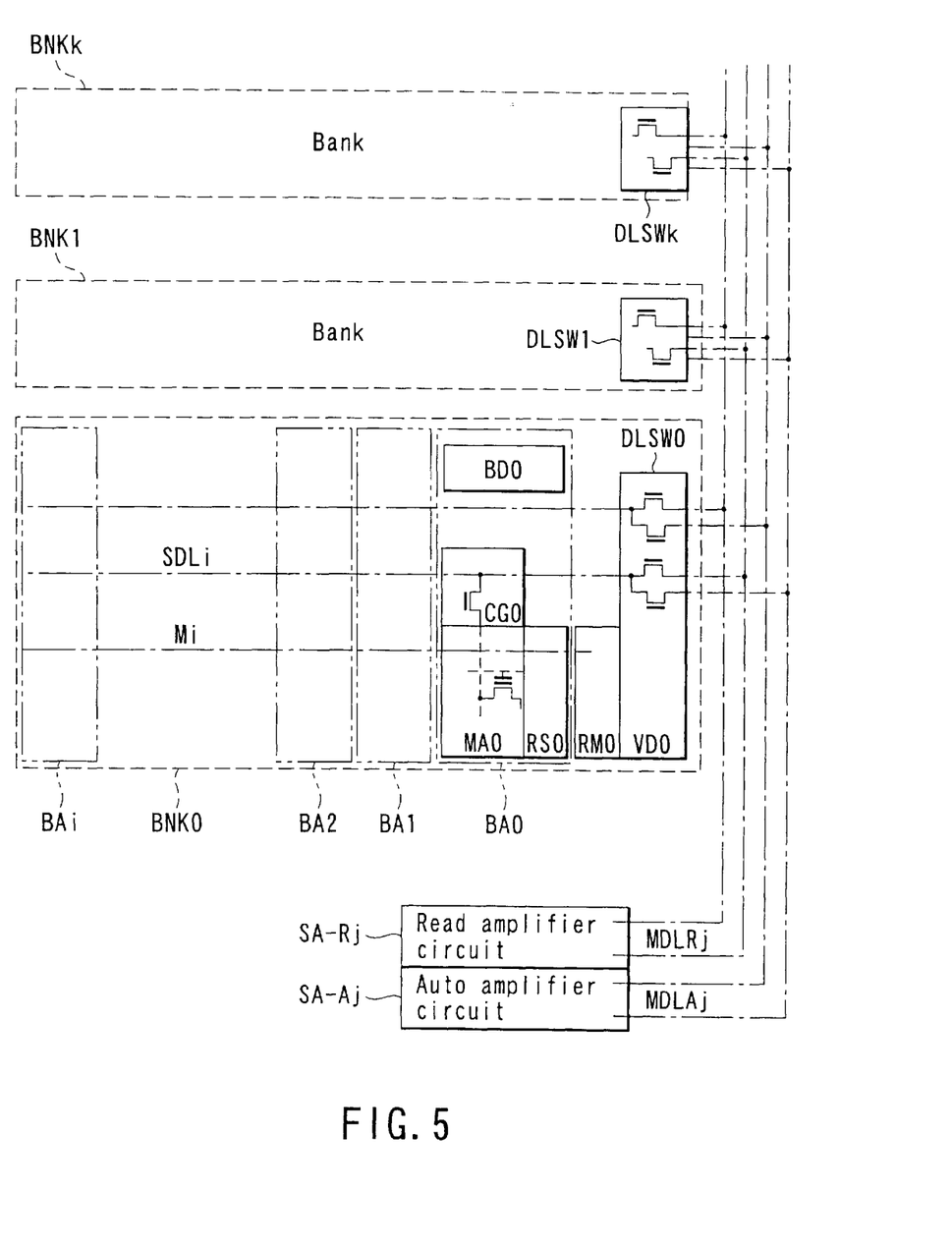
FIG. 5 shows an example of a configuration extracted from a part of simultaneously executable flash memory which is presently proposed.

FIG. 5 shows an example of concrete arrangement of a part of a flash memory, which is proposed at the moment, capable of writing or erasing data and reading out data simultaneously.

As shown in FIG. 5, in a plurality of banks BNK0 to BNKk, one or a plurality of block circuit groups (in the example, BA0 to BAi) are arranged in a first direction, the plurality of banks BNK0 to BNKk are arranged in a second direction perpendicular to the first direction.

In each of the block circuit groups BA0 to BAi, electrically rewritable memory cells having the MOS structure are arranged in a matrix form respectively, a cell array MA0 divided by an erase unit, a sub row selection decoder RS0, the row line WL, the column line BL, a column selection gate CG0 and a block decoder BD0 are provided.

In the banks BNK0 to BNKk, main row selection decoders RM0 to RMk, j data line switching circuits DLSW0 to DLSWk and power supply decoders VD0 to VDk are provided correspondent to each bank.

In each of the banks BNK0 to BNKk, main row selection line Mi connected commonly to the block circuit groups BA0 to BAi in the same bank and j sub data lines SDLj (for example, eight lines or sixteen lines) are also formed.

The sub data lines SDLj on the block circuit groups BA0 to BAi in the same bank are formed by a first wiring layer in the first direction, connected to j column selection gates CG0 in each of block circuit groups BA0 to BAi and connected correspondent to the j data line switching circuits DLSW0 to DLSWk every bank BNK0 to BNKk.

The power supply decoders VD0 to VDk are circuit groups performing power supply control in case of write or erase by a bank unit and decode control for selecting the memory cell.

Out of the bank areas, j main data lines MDL_Rj for read, in which data of the memory cell in a bank selected by read operation (a first operation mode) are read through the j sub data lines and the j data line switching circuits DLSW0 to DLSWk, are formed by a second wiring layer in the second direction. The j main data lines MDL_Rj for read are connected to j amplifier circuits SA_Rj for read.

Out of the bank areas, j main data lines MDL_Aj for auto, in which data of the memory cell in a bank selected by write or erase operation (a second operation mode) are read through the j sub data lines and the j data line switching circuits DLSWi, are formed by the second wiring layer in the second direction. The j main data lines MDL_Aj for auto are connected to j amplifier circuits SA_Aj for auto. Here, "auto" is used to mean verifying cell data automatically in the memory system.

In the above-described arrangement, selection of the cell is performed as follows.

One row line WL is selected by the main row selection decoder RM0 and the sub row line selection decoder RS0 according to an address signal. And block selection and column selection are performed by the block decoder BD0 according to the address signal, and the column line BL is connected to the sub data line SDLj.

In case of reading data, by switching control of the data line switching circuits DLSW0 to DLSWk, the sub data lines SDLj are connected to the amplifier circuits SA_Rj for read through the main data lines MDL_Rj for read. The read of the cell data by the amplifier circuits SA_Rj for read is performed simultaneously correspondent to the number of output circuits (not shown), for example, byte data of eight lines or word data of sixteen lines.

In case of writing or erasing data, by switching control of the data line switching circuits DLSW0 to DLSWk, the sub data lines SDLj are connected to the amplifier circuits SA_Aj for auto through the main data lines MDL_Aj for auto. A check of a write or erase level of the cell is automatically performed by a control circuit (not shown). In this case, the erase of data is performed by a block circuit unit, the block decoder BDi controls such as electric potential control of the source line in case of erasing data.

According to the above-described arrangement, in case that a block in a bank (for example the bank BNK0) is being erased, the sub data lines SDLj in the bank BNK0 are connected to the main data lines MDL_Aj for auto by the data line switching circuit DLSW0 of the bank BNK0. In case that data of other bank (for example the bank BNKk) are wanted to read at the same time, it is possible to read the data of the bank BNKk in a manner that the sub data lines SDLj in the bank BNKk are connected to the main data lines MDL_Rj for read by the data line switching circuit DLSWk of the bank BNKk.

Recently, by demands for high speed of effective read cycle of the flash memory, high performance is required for a device operating in page mode and a device operating in burst mode. These devices have specifications that, for example, data are read together by eight words as one page and outputted serially by a word unit, so that many data lines (SDLj, MDL_Rj and MDL_Aj) are required.

Figure 6:
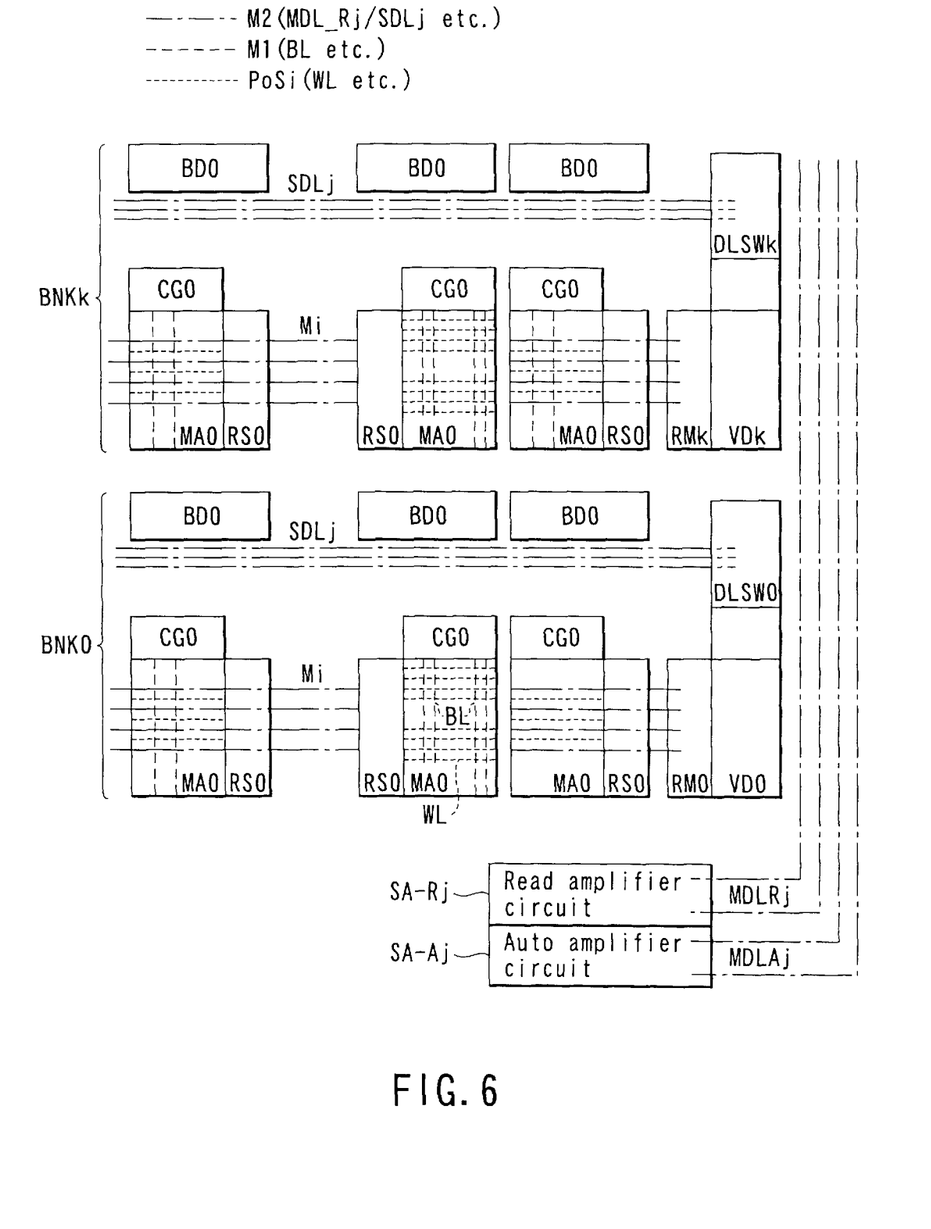
FIG. 6 shows an example of a pattern layout of a wiring layer when the flash memory shown in FIG. 5 is realized by double layer metal wiring.

FIG. 6 shows a pattern layout of a wiring layer in case that the flash memory shown in FIG. 5 is realized by using double layer metal wiring.

In the figure, row lines WLi which are output of sub row selection decoder RSi are made of poly crystalline silicon layer PoSi, column lines BLi are made of a metal M1 of a first layer. Main row selection lines Mi which are output of main row selection decoders RMi are made of a metal M2 of a second layer on cell arrays MAi. Sub data lines SDLj are made of the metal M2 of the second layer on column selection gates CGi or on a side of the column selection gates CGi. Main data lines MDL_Rj for read and main data lines MDL_Aj for auto are made of the metal M2 of the second layer on a power supply decoder VDDi or on a side of the power supply decoder VDDi.

However, in this layout of the wiring layer, as increasing each data line (SDLj, MDL_Rj and MDL_Aj) in the above-described device correspondent to dual work, a chip area of the semiconductor memory device is increases by the increased area for the device correspondent to dual work.

When the device operating in dual work is realized by using the double layer metal wiring, assuming that a pitch of the metal M2 of the second layer, for example, is 1 $\mu$m, the chip area of the device will be discussed in case that two shield lines (CND electric potential) are added to a side of the data lines. That each cell array MAi includes a cell of 512K bits, each bank BNKi includes eight block circuit groups (a cell of 4M bits) and there are eight banks BNKi (a cell of 32M bits) in the device chip will be considered as an example.

In this case, each of data lines (SDLj, MDL_Rj and MDL_Aj) has (8+2) lines in a device reading by a byte unit, so that the occupied area of the data line DLA becomes about 10 $\mu$m, though a ratio of the occupied area of the data line DLA to the chip area is small. In a device reading by a word unit, each of data lines (SDLj, MDL_Rj and MDL_Aj) has (16+2) lines, so that the occupied area of the data line DLA becomes about 18 $\mu$m, though the ratio of the occupied area of the data line DLA to the chip area is also small.

However, for example, in the device operating in page mode of eight word which one word is one page (eight page device), since each of data lines (SDLj, MDL_Rj and MDL_Aj) has (128+2) lines, the occupied area of the data line DLA becomes about as much as 128 $\mu$m, which causes the ratio of the occupied area of the data line DLA to the chip area not to be neglected. This results in an increase of the chip area and a rising cost of production.

As described above, there is a problem that the data lines remarkably increases and the chip area also increases by the increase of the data line area, in case that the device operating in page mode correspondent to dual work is realized to the conventional semiconductor memory device by using the double layer metal wiring.

BRIEF SUMMARY OF THE INVENTION

According to an aspect of the present invention, there is provided a semiconductor memory circuit comprising a plurality of memory cell blocks arranged in a first direction, each of the memory cell blocks including a plurality of memory cells arranged in a matrix form, the plurality of memory cells being of MOS structure and being electrically data rewritable; a plurality of bit lines formed of a plurality of first wiring layers, a plurality of sub data lines formed of a plurality of second wiring layers, the plurality of sub data lines extending in the first direction on the plurality of memory cell blocks and being connected to the plurality of memory cell blocks; a first bank region including at least the plurality of memory cell blocks and the plurality of sub data lines; at least one of second bank region arranged in a second direction perpendicular to the first direction, the second bank region having the same structure as the first bank region; a plurality of data read lines formed of third wiring layers and arranged on the first and second bank regions, the plurality of data read lines configured so that data are read by way of the plurality of data lines from the plurality of memory cells of a bank region of the first and second bank regions selected in a first operation mode; a plurality of first amplifier circuits connected to the plurality of data read lines; a plurality of auto data lines extending in the second direction on a region out of the plurality of memory cell blocks of the first and second bank regions, the plurality of auto data lines configured so that data are read in a second operation mode by way of the plurality of sub data lines from the plurality of memory cells; a plurality of second amplifier circuits connected to the plurality of auto data read lines; a plurality of switch circuits provided in correspondence to the plurality of memory cell blocks of the first and second bank regions, the plurality of switch circuits configured to switch the plurality of sub data lines of the first and second bank regions and the plurality of data read lines between a connection state and a non-connection state in correspondence to the first and second operation modes, wherein data in the plurality of memory cells of the second bank region are readable from the plurality of first amplifier circuits, even when data in the plurality of memory cells of the first bank region is being read from the plurality of second amplifier circuits.

DETAILED DESCRIPTION OF THE INVENTION

Preferred embodiments of the invention will be described in more detail below referring to the accompanying drawings.

Figure 1:
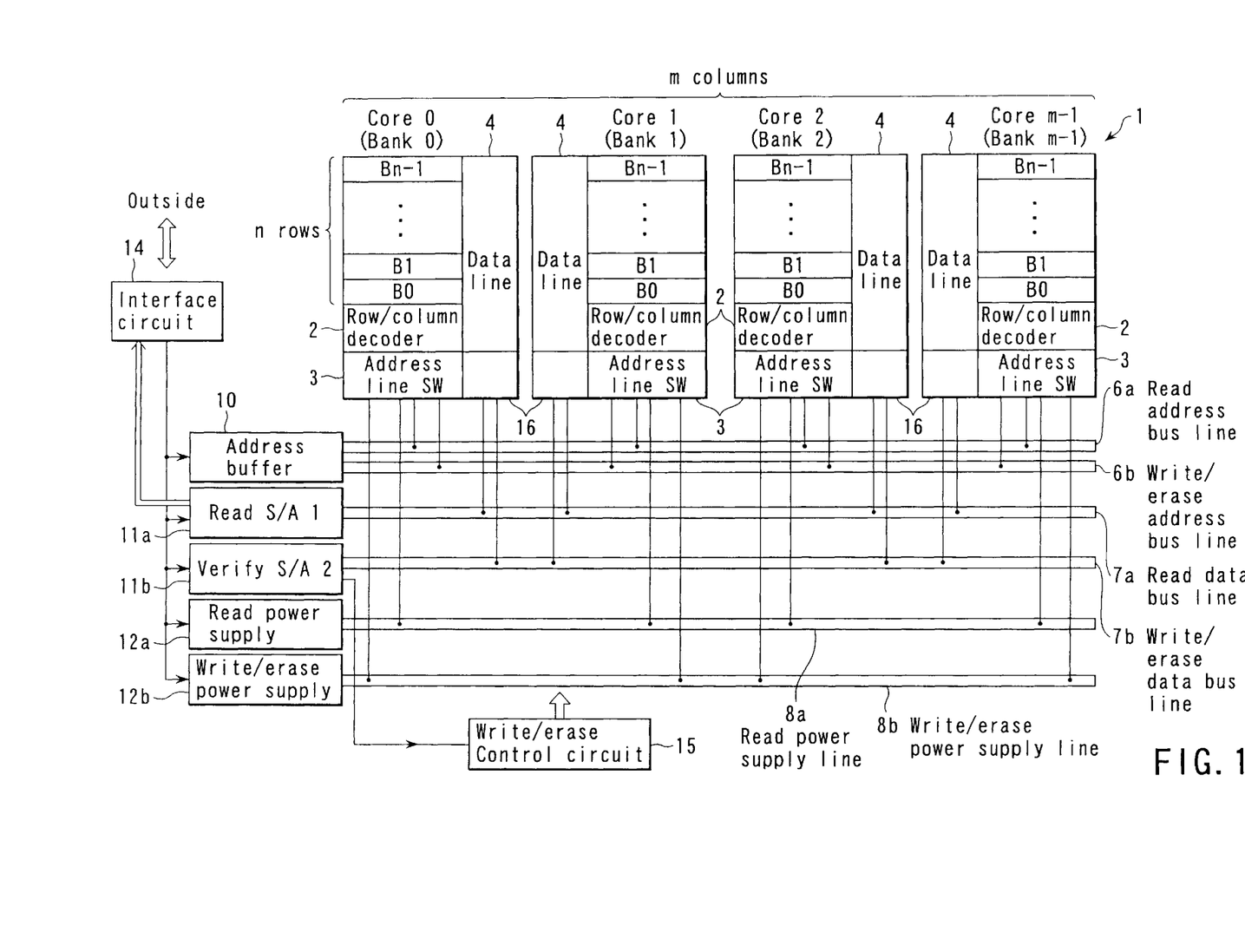
FIG. 1 is a block diagram showing an example of a chip configuration of a simultaneously executable flash memory to which a semiconductor memory device of the invention is applicable.

FIG. 1 shows an example of a chip configuration of a simultaneously executable flash memory as a semiconductor memory device to which the present invention is applicable.

In FIG. 1, a memory cell array 1 includes m cores 0 to m−1 in which n blocks B0 to Bn−1 are arrayed respectively. Each of blocks B0 to Bn−1 is a minimum unit, a plurality of memory cells are arrayed in each of blocks B0 to Bn−1. The memory cell is a kind of nonvolatile memory cell having stacked gate structure. The core is defined as a set of one or a plurality of blocks, each bank is formed by n blocks B0 to Bn−1 in an example of FIG. 1.

A row/column decoder 2 containing a row decoder and a column decoder for selecting the memory cell, a switching circuit (address line SW) 3 for switching address lines or power supply lines, a local data line 4 and a data line switching circuit 16 are provided in each core.

A first address bus line (address bus line for read) 6a for selecting the memory cell in case of read operation of data and a second address bus line (address bus line for write/erase) 6b necessary to auto operation in case of writing or erasing data are provided commonly to all cores in the memory cell array 1.

A first data bus line (data bus line for read) 7a utilized to the read operation of data and a second data bus line (data bus line for write/erase) 7b utilized to the write or erase operation of data are provided commonly to all cores.

A sense amplifier circuit (sense amplifier line for read) 11a for read operation of data and a second amplifier circuit (sense amplifier line for verify) 11b for write or erase operation of data are provided correspondent to the data bus lines 7a and 7b respectively.

A first power supply line (power supply line for read) 8a to which a potential of power supply for read is supplied from a power supply 12a for read and a second power supply line (power supply line for write/erase) 8b to which a potential of power supply for write or erase is supplied from a power supply 12b for write or erase are provided commonly to all cores. Booster voltage is given to the first power supply line 8a from a power source VCC in case of reading data and supplied to the gate of the memory cell, which enables to read.

An address buffer circuit 10 for supplying an address signal to the address bus line 6a for read and the address bus line 6b for write/erase and an interface circuit 14 for interfacing an external unit are provided.

That is to say, the flash memory includes a electrically rewritable non-volatile memory cell, the memory cell array in which a plurality of cores are arrayed, wherein one core is a set of one or a plurality of blocks and one block is a range of the memory cell to be a unit of data erase, core selection means for selecting a predetermined number of cores in the plurality of cores in order to write or erase data, data write means for writing data in the selected memory cell in the core which is selected by the core selection means, data erase means for erasing data of the selected block in the core which is selected by the core selection means, and data read means for reading data of the memory cell in the core which is not selected by the core selection means.

Operation of the flash memory will be simply described below.

The address signal inputted from the outside is supplied to the address buffer circuit 10 through an address input circuit in the interface circuit 14. An address for read and an address for write or erase are supplied from the address buffer circuit 10 to the address bus lines 6a and 6b according to an operation mode respectively. The addresses supplied to each of address bus lines 6a and 6b are selectively transferred to the row/column decoder 2 in each core by the switching circuit (address line SW) 3, which is provided in each core, for switching the address line and the power supply line. The power supply lines 8a and 8b are also supplied to the row/column decoder 2 in each core with the power supply lines 8a and 8b selectively switched by the switching circuit 3.

In each core, the local data line 4 is connected to the data bus line 7a for read by a data line switching circuit 16 in case of reading data and connected to the data bus line 7b for write/erase by a data line switching circuit 16 in case of writing or erasing data.

That is to say, data in the selected memory cell of each core are read to the local data line 4, transferred to the data bus line 7a or 7b by the data line switching circuit 16 according to the operation mode and detected by the sense amplifier circuit 11a for read or the sense amplifier circuit 11b for verify to amplify respectively.

The result of the read by the sense amplifier circuit 11b for verify is sent to a write/erase control circuit 15. In the write/erase control circuit 15, it is decided whether write or erase is successful or not, control of re-write or re-erase is performed in case that it is unsuccessful.

As described above, even though the read operation of data and the write or erase operation of data are performed simultaneously, each operation can be controlled by the independent address bus line, data bus line, sense amplifier circuit and power supply circuit.

As an example in case that the write operation of data and the read operation of data are performed simultaneously, the operation that the write of the data is performed to the core 0 and the cell data in other cores are read will be described concretely.

When the selection address signal of the core 0 portion is inputted and a write command is inputted from the outside of the chip, the write command is decided by the interface circuit 14, which causes a write flag to be on. When the flag is on, by the switching circuit 3 in the core 0 portion, the address signal of the address bus line 6b for write/erase is inputted to the row/column decoder 2 and power of the power supply 12b for write and erase is supplied. By the data line switching circuit 16, the data line 4 in the core 0 portion is connected to the data bus line 7b for write/erase connected to the sense amplifier circuit 11b for verify.

By setting the address bus line, data bus line and the power supply line in such a way, boosted write voltage is applied to a selected row line and high voltage or low voltage is applied from the write control circuit 15 to a column line correspondent to the write data in the core 0. This causes hot electrons to be injected to the floating gate in the selected memory cell to write data in case that the memory cell is the floating gate type of MOS transistor structure. When the write of the data of one time is finished, the data are read to be detected by the sense amplifier circuit 11b for verify. Then verify of the data is decided by the write/erase control circuit 15, the operation is finished in case that the write of the data is successful, or additional re-write of the data is performed in case that the write of the data is unsuccessful.

It is possible to read data in any other core, for example in the core 1 during writing data to the core 0. That is to say, the address signal of the address bus line 6a for read and the power supply output of the power supply 12a for read are supplied to the row/column decoder 2 of the core 1 including the memory cell to be wanted to read by the inputted address from the outside. The data line 4 is connected to the data bus line 7a for read through the switching circuit 16. The address signal is not inputted to the row/column decoders 2 of the cores except the cores 0 and 1, namely the cores not to be written and read, and the data bus line is not connected to them, either.

The data read from the selected memory cell in the core 1 are detected by the sense amplifier circuit 11a through the data bus line 7a for read to be amplified. The data are outputted to the outside of the chip through the interface circuit 14.

Any core, namely any one of the core 1, the core 2, the core 3 and the core m−1, except the core 0 in which the write of the data is being performed can be read optionally. It is prohibited that the address of the core 0 in which the write of the data is being performed is inputted to perform the read of the data. In case that the read of the data is required to the core in which the write of the data is being performed, a busy signal showing that the selected core is in operation of writing the data is outputted to inform to the outside.

The operation that the erase operation of data and the read operation of data are performed simultaneously is also basically the same as the operation that the write operation of data and the read operation of data are performed simultaneously.

The operation when the erase of the data is performed to, for example, the selected block of the core 0 and the cell data in other cores are read will be described.

When the selected address signal of the block in the core 0 and an erase command are inputted from the outside of the chip, the erase command is decided by the interface circuit 14 to raise an erase flag. When the erase flag is on, by the switching circuit 3 of the core 0, the address signal of the address bus line 6b for write/erase is inputted to the row/column decoder 2 of the core 0 and electric potential of the power supply for erase of the power supply 12b for write/erase is supplied. The data line 4 of the core 0 is connected to the data bus line 7b for write/erase connected to the sense amplifier circuit 11b for verify by the data line switching circuit 16.

By setting the address bus line, the data bus line and the power supply line, negative voltage is applied to all row lines of the selected block of the core 0 and positive high voltage for erase is applied to open and source lines of the column line, which causes the data of the block in the core 0 to be erased.

When the erase of the data of one time is finished, the data are read to be detected by the sense amplifier circuit 11b for verify. Then verify of the data is decided by the write/erase control circuit 15, the operation is finished in case that the erase of the data is successful, or the additional erase of the data is performed in case that the erase of the data is unsuccessful.

In case that the read of the data is required to any other core except the core 0 during erasing the data to the core 0, the read of the data in the core is performed.

Figure 2:
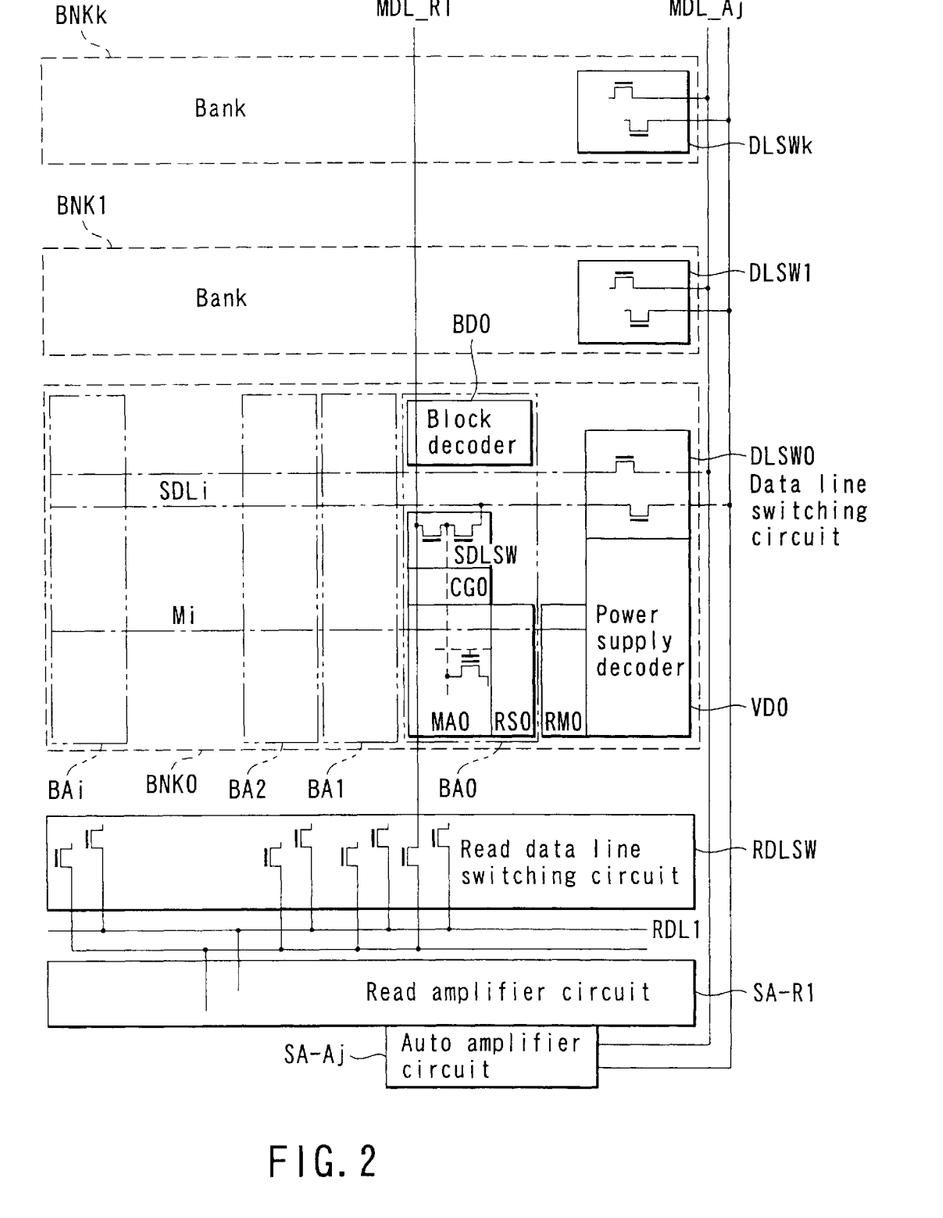
FIG. 2 is a circuit diagram showing a part of a flash memory according to a first embodiment of a semiconductor memory device of the invention.

FIG. 2 is a circuit diagram showing a part of a flash memory according to an embodiment of the invention.

In the flash memory shown in FIG. 2, though a basic circuit configuration is the same as that of the flash memory shown in FIG. 1, the flash memory shown in FIG. 2 is characterized in that the device operating in page mode correspondent to dual work is realized by forming the main data line MDL_R1 for read on the memory cell array, forming the main data line MDL_Aj for auto in an area separated from the memory cell array and using a wiring layer in which three metal layers are superposed.

The flash memory in FIG. 2 is different from following points compared with the flash memory described referring to FIG. 5. Since other parts of the flash memory in FIG. 2 are the same as that of the flash memory described referring to FIG. 5, the same numerals and signs are used.

(1) In each of the block circuit groups BA0 to BAi, a sub data line switching circuit SDLSW for switching connection/disconnection between the sub data line SDLj and the main data line MDL_R1 for read is added.

(2) In the outside of the memory cell array, the main data line MDL_R1 for read is connected selectively to the read data line RDL1 by a read data line switching circuit RDLSW, the read data line RDL1 is connected to the amplifier circuit SA_R1 for read.

In FIG. 2, one to a plurality of block circuit groups (BA0 to BAi in the example) are arranged in a first direction to constitute the plurality of banks BNK0 to BNKk, the plurality of banks BNK0 are arranged in a second direction perpendicular to the first direction.

Each of the block circuit groups BA0 to BA1 is constituted with the electrically writable MOS structure memory cell arranged in a matrix form, the cell array MA0 divided by an erase unit, the sub line selection decoder RS0, the row line WL, the column line BL, the column selection gate CG0, the block decoder BD0 and the sub data line switching circuit SDLSW are provided in each of the block circuit groups BA0 to BA1.

In each of the banks BNK0 to BNKk, the main row selection decoders RM0 to RMk, the j data line switching circuits DLSW0 to DLSWk, the power supply decoders VD0 to VDk are provided correspondent to each of the banks BNK0 to BNKk.

The main row selection line Mi and the j sub data lines SDLj (for example eight lines or sixteen lines), which are connected commonly to the block circuit groups BA0 to BAi in the same bank, are formed in each bank BNK0 to BNKk.

The sub data line SDLj is formed on the block circuit groups BA0 to BAi in the same bank by a first wiring layer in the first direction, and connected to the j column selection gates CG0 of each of the block circuit groups BA0 to BAi through the sub data line switching circuit SDLSW. The sub data line SDLj is also connected correspondent to the j data line switching circuits DLSW0 to DLSWk every bank BNK0 to BNKk.

The power supply decoders VD0 to VDk are a circuit group performing power supply control in case of write/erase by a bank unit and decode control for memory cell selection.

On each of the banks BNK0 to BNKk, the j main data lines MDL_R1 for read, in which the memory cell data in the selected bank in the read operation (the first operation mode) are read through the sub data line switching circuit SDLSW, are formed by a second wiring layer in the second direction.

Out of the bank areas, the read data line switching circuit SDLSW connected to the read data line RDL1 and the read data line RDL1 are provided, the read data line RDL1 is connected to the amplifier circuit SA_R1 for read.

Furthermore, out of the bank areas (or on an area eliminating the block circuit groups BA0 to BAi), the j main data lines MDL_Aj for auto, in which the memory cell data are read through the j sub data lines the j data line switching circuits DLSW0 to DLSWk in the write/erase operation (the second operation mode), and the j amplifier circuits SA_Aj for auto connected to the main data line MDL_Aj for auto are provided.

The sub data line switching circuits SDLSW in each of the block circuit groups BA0 to BAi have a function switching connected state/disconnected state between the sub data line SDLj and the main data line MDL_R1 for read correspondent to the read operation (the first operation mode) and the write/erase operation (the second operation mode).

On the other hand, the data line switching circuits DLSW0 to DLSWk in each of the banks BNK0 to BNKk are used for switching connected state/disconnected state only between the sub data line SDLj and the main data line MDL_Aj for auto, the data line switching circuits DLSW0 to DLSWk have a function reducing parasitic capacity of the main data line MDL_Aj for auto by making the disconnected state in case of unnecessity of connection. It is also possible that the data line switching circuits DLSW0 to DLSWk are omitted and the sub data line SDLj is connected directly to the main data line MDL_Aj for auto.

Figure 3:
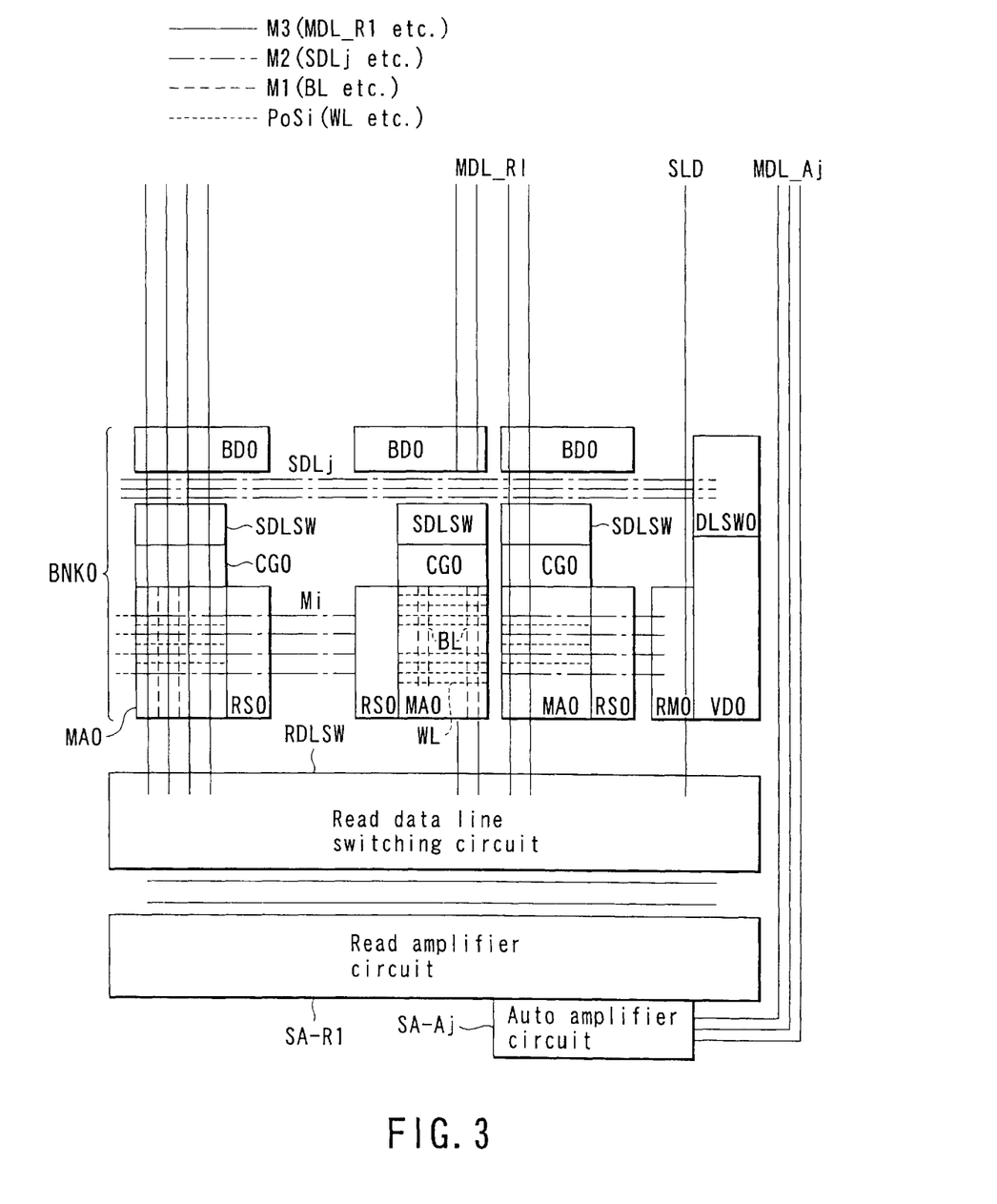
FIG. 3 shows an example of a pattern layout when the flash memory shown in FIG. 2 is realized by a wiring layer structure in which three metal layers are superposed.

FIG. 3 shows an example of a pattern layout in case that the flash memory shown in FIG. 2 is realized by a wiring layer in which three metal layers are superposed.

The row line WL of the memory cell which is output of the sub line selection decoder RS0 is made of a polycrystalline silicon layer PoSi, the column line BL is made a metal M1 of a first layer (hereinafter referred to as "M1 layer").

The main row selection line Mi which is output of the main row selection decoder RM0 is made of a metal M2 of a second layer (hereinafter referred to as "M2 layer") on the cell array MA0 of each block circuit group BA0 to BAi in a first direction.

The sub data line SDLj is made of the M2 layer on the sub data line switching circuit SDLSW or along a side of the sub data line switching circuit SDLSW in the first direction.

The main data line MDL_R1 for read is made of a metal M3 of a third layer (hereinafter referred to as "M3 layer") on the block circuit groups BA0 to BAi of each of the banks BNK0 to BNKk in a second direction.

The main data line MDL_Aj for auto is made of the M3 layer or the M2 layer on the power supply decoders VD0 to VDk of each of the banks BNK0 to BNKk and the data line switching circuits DLSW0 to DLSWk or along a side of them in the second direction.

The read data line RDL1 is made of the M3 layer or the M2 layer in the first direction.

For obtaining an effect of electrical shield between the main data line MDL_R1 for read and the main data line MDL_Aj for auto, one or a plurality of shield lines SLD may be provided between them, for example, on the bank area.

The wiring layer of the main row selection line Mi of output in the main row selection decoder RM0 the wiring layer of the main data line MDL_R1 for read may be reversal.

According to the flash memory described above, the device operating in page mode correspondent to dual work can be realized by using a wiring layer made of superposed three metal layers in a manner that the main data line MDL_R1 for read is formed on the memory cell array and the main data line MDL_Aj for auto is formed in an area separated from the memory cell array.

An example of a modification of the pattern layout will be described hereinafter.

In the embodiment of the flash memory, however it is necessary that the main data line MDL_R1 for read has the number of lines (128 lines for 8 words a page) correspondent to a specification to be read simultaneously, it is not always necessary that the number of the main data lines MDL_Aj for auto is the same number of the main data lines MDL__R1 for read, for example an arrangement of about sixteen main data line MDL__Aj for auto is not a problem.

By modifying the number of the main data lines MDL__Aj for auto so as to reduce the number of the main data lines MDL__Aj for auto than that of the main data lines MDL__Rj for read, the increase of the chip area of the memory can be restrained to the minimum.

As described above, according to the semiconductor memory device according to the embodiment of the invention, when the device operating in page mode correspondent to dual work is realized, even though the memory cell to be read is increased, the increase of an occupied area of the read data line is restrained, which enables the increase of the chip area and the rising cost of the production to be restrained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory circuit comprising:
   a plurality of memory cell blocks arranged in a first direction, each of the memory cell blocks including a plurality of memory cells arranged in a matrix form, the plurality of memory cells being of MOS structure and being electrically data rewritable;
   a plurality of bit lines formed of a plurality of first wiring layers,
   a plurality of sub data lines formed of a plurality of second wiring layers, the plurality of sub data lines extending in the first direction on the plurality of memory cell blocks and being connected to the plurality of memory cell blocks;
   a first bank region including at least the plurality of memory cell blocks and the plurality of sub data lines;
   at least one of second bank region arranged in a second direction perpendicular to the first direction, the second bank region having the same structure as the first bank region;
   a plurality of data read lines formed of third wiring layers and arranged on the first and second bank regions, the plurality of data read lines configured so that data are read by way of the plurality of data lines from the plurality of memory cells of a bank region of the first and second bank regions selected in a first operation mode;
   a plurality of first amplifier circuits connected to the plurality of data read lines;
   a plurality of auto data lines extending in the second direction on a region out of the plurality of memory cell blocks of the first and second bank regions, the plurality of auto data lines configured so that data are read in a second operation mode by way of the plurality of sub data lines from the plurality of memory cells;
   a plurality of second amplifier circuits connected to the plurality of auto data read lines;
   a plurality of switch circuits provided in correspondence to the plurality of memory cell blocks of the first and second bank regions, the plurality of switch circuits configured to switch the plurality of sub data lines of the first and second bank regions and the plurality of data read lines between a connection state and a non-connection state in correspondence to the first and second operation modes, wherein
   data in the plurality of memory cells of the second bank region are readable from the plurality of first amplifier circuits, even when data in the plurality of memory cells of the first bank region is being read from the plurality of second amplifier circuits.

2. A semiconductor memory circuit according to claim 1, further comprising a connection circuit configured to electrically connect the plurality of sub data lines to the plurality of auto data lines.

3. A semiconductor memory circuit according to claim 1, in which the plurality of second wiring layers forming the plurality of sub data lines of the first and second bank regions are provided on a layer lower than a layer in which the plurality of third layers are provided.

4. A semiconductor memory circuit according to claim 2, in which the plurality of second wiring layers forming the plurality of sub data lines of the first and second bank regions are provided on a layer lower than a layer in which the plurality of third layers are provided.

5. A semiconductor memory circuit according to claim 1, in which the plurality of auto data lines are formed of a plurality of wiring layers provided on a layer on which the plurality of third wiring layers are provided.

6. A semiconductor memory circuit according to claim 2, in which the plurality of auto data lines are formed of a plurality of wiring layers provided on a layer on which the plurality of third wiring layers are provided.

7. A semiconductor memory circuit according to claim 3, in which the plurality of auto data lines are formed of a plurality of wiring layers provided on a layer on which the plurality of third wiring layers are provided.

8. A semiconductor memory circuit according to claim 4, in which the plurality of auto data lines are formed of a plurality of wiring layers provided on a layer on which the plurality of third wiring layers are provided.

9. A semiconductor memory circuit according to claim 1, in which the plurality of auto data lines are formed of a plurality of wiring layers provided on a layer on which the plurality of second wiring layers are provided or a layer upper than a layer on which the third wiring layers are provided.

10. A semiconductor memory circuit according to claim 2, in which the plurality of auto data lines are formed of a plurality of wiring layers provided on a layer on which the plurality of second wiring layers are provided or a layer upper than a layer on which the third wiring layers are provided.

11. A semiconductor memory circuit according to claim 3, in which the plurality of auto data lines are formed of a plurality of wiring layers provided on a layer on which the plurality of second wiring layers are provided or a layer upper than a layer on which the third wiring layers are provided.

12. A semiconductor memory circuit according to claim 4, in which the plurality of auto data lines are formed of a plurality of wiring layers provided on a layer on which the plurality of second wiring layers are provided or a layer upper than a layer on which the third wiring layers are provided.

13. A semiconductor memory circuit according to claim 1, in which the plurality of data read lines extend in the second direction.

14. A semiconductor memory circuit according to claim 2, in which the plurality of data read lines extend in the second direction.

15. A semiconductor memory circuit according to claim 1, in which the plurality of second amplifier circuits are less in number than the plurality of first amplifier circuits.

16. A semiconductor memory circuit according to claim 2, in which the plurality of second amplifier circuits are less in number than the plurality of first amplifier circuits.

17. A semiconductor memory circuit according to claim 3, in which the plurality of second amplifier circuits are less in number than the plurality of first amplifier circuits.

18. A semiconductor memory circuit according to claim 1, in which the plurality of data read lines are arranged substantially in parallel to the plurality of auto data lines, and a shield line is provided between the plurality of data read lines and the plurality of auto data lines.

19. A semiconductor memory circuit according to claim 2, in which the plurality of data read lines are arranged substantially in parallel to the plurality of auto data lines, and a shield line is provided between the plurality of data read lines and the plurality of auto data lines.

20. A semiconductor memory circuit according to claim 3, in which the plurality of data read lines are arranged substantially in parallel to the plurality of auto data lines, and a shield line is provided between the plurality of data read lines and the plurality of auto data lines.

* * * * *